United States Patent
Takei (10) Patent No.: US 7,601,597 B2
(45) Date of Patent: Oct. 13, 2009

(54) MANUFACTURING METHOD OF A SUPER-JUNCTION SEMICONDUCTOR DEVICE

(75) Inventor: Manabu Takei, Shiojiri (JP)

(73) Assignee: Fuji Electric Device Technology Co., Ltd., Tokyo (JP)

( * ) Notice: Subject to any disclaimer, the term of this patent is extended or adjusted under 35 U.S.C. 154(b) by 0 days.

(21) Appl. No.: 11/855,093

(22) Filed: Sep. 13, 2007

(65) Prior Publication Data

US 2008/0102582 A1   May 1, 2008

(30) Foreign Application Priority Data

Oct. 19, 2006   (JP)   ............... 2006-285310

(51) Int. Cl.
H01L 21/336 (2006.01)
H01L 29/78 (2006.01)

(52) U.S. Cl. ............. 438/270; 438/297; 257/E21.41; 257/E21.417

(58) Field of Classification Search ............... 438/270, 438/297; 257/E21.41, E21.417
See application file for complete search history.

(56) References Cited

U.S. PATENT DOCUMENTS

| | | | |
|---|---|---|---|
| 4,754,310 A | 6/1988 | Coe | |
| 5,216,275 A | 6/1993 | Chen | |
| 5,438,215 A | 8/1995 | Tihanyi | |
| 6,081,009 A | 6/2000 | Neilson | |
| 6,291,856 B1 | 9/2001 | Miyasaka et al. | |
| 6,475,864 B1 * | 11/2002 | Sato et al. | 438/268 |
| 6,512,268 B1 | 1/2003 | Ueno | |
| 6,693,323 B2 | 2/2004 | Sato et al. | |
| 7,037,789 B2 | 5/2006 | Yamauchi et al. | |
| 2003/0008483 A1 * | 1/2003 | Sato et al. | 438/514 |
| 2007/0045727 A1 * | 3/2007 | Shiraishi et al. | 257/335 |

FOREIGN PATENT DOCUMENTS

JP   2002-83962 A   3/2002
JP   2004-14554 A   1/2004

* cited by examiner

Primary Examiner—Matthew Smith
Assistant Examiner—Walter H Swanson
(74) Attorney, Agent, or Firm—Rossi, Kimms & McDowell, LLP

(57) ABSTRACT

A manufacturing method for a super-junction semiconductor device is disclosed. The method includes a first step of depositing, on a low-resistivity semiconductor substrate of one conductivity type, at least an epitaxial layer of the one conductivity type which is to become a drift layer; a second step of forming a base region(s) of the other conductivity type and source regions of the one conductivity type to be used for formation of MOS gate structures; a third step of forming, by anisotropic vapor-phase etching using an insulating film mask, trenches that penetrate through the base region(s) and reach the low-resistivity semiconductor substrate or its vicinity; and a fourth step of burying epitaxial layers of the other conductivity type in the respective trenches, the first to fourth steps being executed in this order.

4 Claims, 9 Drawing Sheets

MANUFACTURING METHOD OF A SUPER-JUNCTION SEMICONDUCTOR DEVICE

CROSS REFERENCE TO RELATED APPLICATIONS

This application claims priority from application Serial No. JP 2006-285310, filed on Oct. 19, 2006, the contents of which are incorporated herein in their entirety.

BACKGROUND OF THE INVENTION

A. Field of the Invention

The present invention relates to a power semiconductor device and, more specifically, to a super-junction (hereinafter may be abbreviated as SJ) MOSFET.

B. Description of the Related Art

A MOSFET has been developed which broke through the characteristic limit of conventional silicon MOSFETs by employing, as a drift region, what is called a super-junction structure (hereinafter may be referred to as "p-type/n-type column structure" or "SJ column structure"). A super-junction structure is a collection of column-shaped p-type and n-type regions that are arranged in parallel and in close contact with each other on a high-impurity-concentration (hereinafter referred to as low-resistivity) semiconductor substrate and that extend perpendicularly to its major surface. Mass-production of an SJ-MOSFET initially used a manufacturing method called a multi-stage epitaxial method to realize the super-junction structure. The multi-stage epitaxial method is as follows. An epitaxial layer to serve as a drift layer is grown on a low-resistivity semiconductor substrate in several steps. Patterning and ion implantation are repeated in such a manner that p-type regions and n-type regions having fixed patterns are formed in the epitaxial growth stages of the respective layers, whereby the p-type regions and the n-type regions are connected to each other in the direction perpendicular to the major surface. In this manner, a super-junction structure is formed as a collection of p-type and n-type column-shaped regions that are arranged parallel with each other and extend perpendicularly to the major surface. However, this method requires a long, complex manufacturing process and hence the manufacturing cost and the chip cost are high.

On the other hand, in recent years, a buried-trench SJ-MOSFET has been developed which can reduce the manufacturing cost. This type of SJ-MOSFET is manufactured in the following manner. A wafer is formed in which an n-type epitaxial layer is grown on a low-resistivity n-type semiconductor substrate. Trenches are formed at prescribed intervals, so as to penetrate through the n-type epitaxial layer and reach the low-resistivity n-type semiconductor substrate, by performing etching from the wafer front side (in some cases, trenches are formed so as not to completely penetrate through the n-type epitaxial layer and hence not to reach the substrate). Then, the trenches are filled in completely by causing p-type epitaxial layers to grow in the respective trenches, whereby a p-type/n-type column structure is formed. The manufacturing process of this method is shorter and simpler than that of the above-described multi-stage epitaxial method, and hence this method may reduce the manufacturing cost.

In versions of the buried-trench epitaxial method that have been developed to date, MOS gate structures each of which consists of p-type base regions, n-type source regions, a gate oxide film, a channel region, etc of a MOSFET are formed after formation of a p-type/n-type column structure. However, a phenomenon occurs that the impurities in the p-type and n-type columns move by diffusion due to thermal history that is necessary for formation of the MOS gate structures. If the p-type or n-type impurity in each column diffuses into other columns (mutual diffusion), the net doping concentration (i.e., the difference between the p-type doping concentration and the n-type doping concentration) of each column decreases. To compensate for this phenomenon, it is necessary to set the p-type and n-type impurity dopes higher in advance (otherwise the on-resistance becomes high). This increases the absolute values of the variations of the impurity dopes, which leads to a problem that resulting large variations in breakdown voltage lower the breakdown-voltage-related yield. The above problem of mutual diffusion is unavoidable also in the above-described multi-stage epitaxial method which is already in the mass-production stage, and is one of reasons why the breakdown-voltage-related yield of SJ-MOSFETs generally is not very high.

Figure 2A:
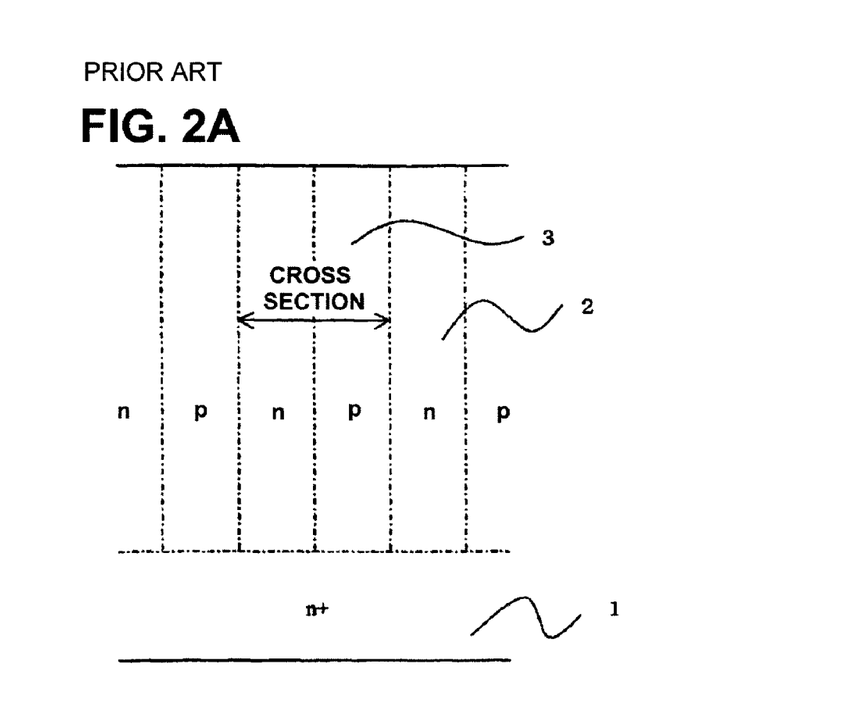
FIG. 2A is a schematic sectional view of a column structure for illustration of a mutual diffusion phenomenon of a conventional SJ-MOSFET.

FIG. 2A is a schematic sectional view of an SJ column structure for illustration of the above-described impurity mutual diffusion phenomenon. As shown in FIG. 2A, an SJ column structure which is a collection of p-type regions 3 and n-type regions 2 is formed on low-resistivity n-type semiconductor substrate 1. The solid line in FIG. 2B indicates a net doping concentration profile (which is step-like at the pn junction), taken across the cross section, of a portion indicated by an arrow in FIG. 2A in the case where the SJ-MOSFET is not subjected to any thermal history after formation of the SJ column structure. The broken line in FIG. 2B indicates a net doping concentration profile in the case where the SJ column structure is subject to thermal history and in view of reductions in doping concentrations due to mutual diffusion the SJ column structure is given higher impurity concentrations in advance so that the total net doping of p-type region 3 and n-type region 2 are made equivalent to those of the solid-line curve of FIG. 2A due to mutual impurity diffusion that is caused by the thermal history. Since the total net doping of p-type region 3 and n-type region 2 indicated by the solid line are equivalent to those indicated by the broken line, the breakdown voltage obtained when a reverse bias is applied in the case where the net doping concentration profile is as indicated by the solid line is approximately equal to that in the case where the net doping concentration profile is as indicated by the broken line. (More strictly, because of the difference between the two net doping concentration profiles, different space charge profiles occur when the regions concerned are depleted. Therefore, a small difference exists between the electric field strength profiles and hence a small difference occurs between the breakdown voltages, each of which is the integral of an electric field.)

Figure 2B:
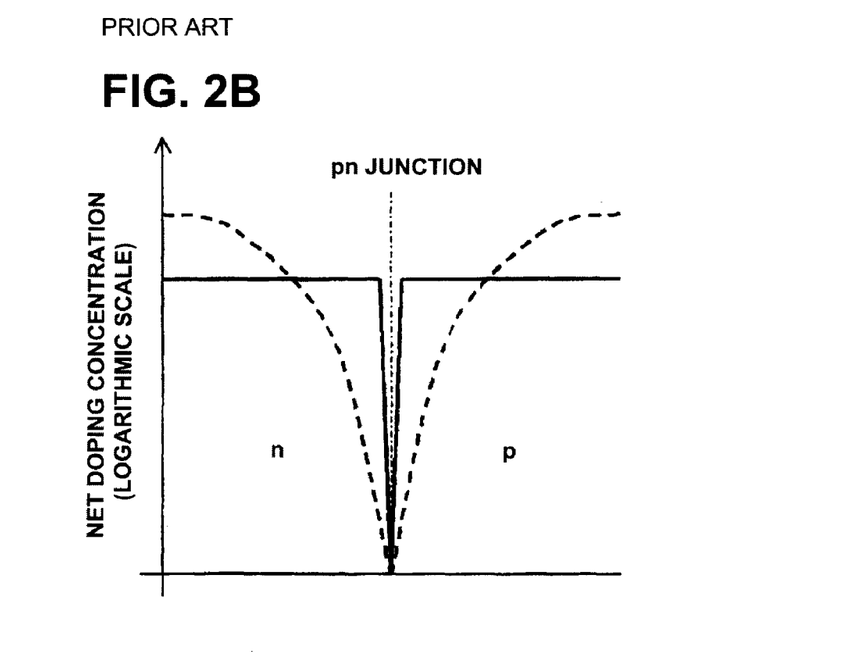
FIG. 2B is a graph of net doping concentration profiles of the conventional SJ-MOSFET of FIG. 2A.

Furthermore, the on-resistances of the two cases are approximately identical. In the case of an n-channel MOSFET, the carriers are electrons and hence the resistance of n-type region 2 (one layer) will be calculated below. In the case of the step-like profile indicated by the solid line in FIG. 2B, the electric conductance $\sigma_1$ of the one-layer n-type region 2 is given by $$\sigma_1 = s_0 D q \rho_{n0} \mu_n / l \, (\Omega^{-1}) \quad (1)$$

where $s_0$ is the width of n-type region 2 across its cross section, D is the depth of n-type region 2, l is the height of n-type region 2, q is the amount of the elementary electric charge, $\rho_{n0}$ is the n-type net doping concentration, and $\mu_n$ is the electron mobility.

In the case of the profile indicated by the broken line in FIG. 2B in which mutual diffusion is taken into consideration, the electric conductance $\sigma_2$ of the n-type region 2 is given by $$\sigma_2 = \int q \rho_n(s) \mu_n D ds / l \, (\Omega^{-1}) \quad (2)$$

where $\rho_n(s)$ is the net doping concentration distribution along the cutting line, and s is the position on the cutting line. The integration is done over the width of the n-type region 2. If the mobility is constant, Equation (2) is modified as follows:

$$\sigma_2 = q \mu_n D \int \rho_n(s) ds / l \quad (3)$$

Since the total net doping of n-type region 2 in the case with mutual diffusion is equivalent to that of the case without mutual diffusion, a relationship $$Dl \int \rho_n(s) ds = s_0 Dl \rho_{n0} \quad (4)$$

holds. From equations (3) and (4), we obtain $$\sigma_2 = q \mu_n D s_0 \rho_{n0} / l = \sigma_1. \quad (5)$$

That is, the on-resistance in the case with mutual diffusion is equal to that in the case without mutual diffusion. However, in actuality, although the total net doping is the same, the total doping concentration (i.e., the sum of the p-type doping concentration and the n-type doping concentration) increases due to the mutual diffusion and hence the mobility decreases a little (the mobility depends on the total doping concentration). Therefore, the resistance of n-type region 2 is a little increased by the mutual diffusion.

As described above, even if mutual impurity diffusion occurs between p-type regions (columns) 3 and n-type regions (columns) 2 because the SJ column structure is subjected to thermal history, the on-resistance/breakdown voltage tradeoff is hardly deteriorated. However, this is true only under ideal conditions that the concentrations of introduced impurities have no variations.

In practice, the p-type and n-type impurity concentrations vary due to variations in a manufacturing process. For example, assume a junction, having a step-like profile, of a p-type region (column) and an n-type region (column) each of which has an impurity concentration of $1 \times 10^{15}$ cm$^{-3}$. If it is assumed that the variation of each impurity concentration due to variations in a manufacturing process is ±10%, that is, ±$1 \times 10^{14}$ cm$^{-3}$, in the worst case the p-type concentration becomes $1.1 \times 10^{15}$ cm$^{-3}$ and the n-type concentration becomes $0.9 \times 10^{15}$ cm$^{-3}$; the charge balance between the p-type region and the n-type region is calculated as 1.1/0.9=122%. This charge imbalance lowers the breakdown voltage.

Next, consideration will be given to the case in which there is mutual diffusion. For example, assume that the doping concentration of each of the p-type region (column) and the n-type region (column) is decreased by $1 \times 10^{15}$ cm$^{-3}$ by the mutual diffusion (since the doping effects of the pair of dopants, that is, the p-type dopant and the n-type dopant, cancel each other out, the decrease in the doping concentration of the p-type region (column) is equal to that in the doping concentration of the n-type region (column)). It is necessary that the concentration of each of the p-type region (column) and the n-type region (column) before the SJ column structure be subjected to thermal history be set at $2 \times 10^{15}$ cm$^{-3}$ (step-like profile). If it is assumed that the variation of each impurity concentration due to variations in a manufacturing process is ±10%, that is, ±$2 \times 10^{14}$ cm$^{-3}$, and that the doping concentration is decreased by $1 \times 10^{15}$ cm$^{-3}$ by the mutual diffusion, in the worst case the concentration of the p-type region (column) becomes $1.2 \times 10^{15}$ cm$^{-3}$ and the concentration of the n-type region (column) becomes $0.8 \times 10^{15}$ cm$^{-3}$; the charge balance between the p-type region (column) and the n-type region (column) is calculated as 1.2/0.8=150%. This charge imbalance lowers the breakdown voltage to a large extent. As is understood from the above discussion, in the case with mutual diffusion, the influence of variations in a manufacturing process is amplified when it is intended to obtain the same electrical characteristics. The breakdown-voltage-related yield is thereby lowered.

In the manufacturing method of the buried-trench SJ-MOSFET, the factors causing variations in the impurity concentrations of the p-type regions (columns) and the n-type regions (columns) include variations of the impurity concentration of the n-type epitaxial regions, the impurity concentration of the p-type buried epitaxial regions, the trench width, and the trench taper angle. These factors cause a charge imbalance between the p-type regions (columns) and the n-type regions (columns). If the thermal history is made more severe, the influence of the above variations becomes more serious. One method for preventing the breakdown-voltage-related yield from being lowered even if the thermal history is made more severe is to set the original impurity concentrations of the p-type regions (columns) and the n-type regions (columns) low. However, these impurity concentrations cannot be set low because doing so increases the on-resistance. Therefore, it can be said that it is desirable to decrease the number of thermal history events that cause mutual diffusion after formation of the p-type regions (columns) and n-type regions (columns).

In connection with the manufacturing method of the above-described buried-trench SJ-MOSFET, US-A1-2003-0008483 (corresponding to JP-A-2002-83962) is known which discloses a manufacturing method of an SJ-MOSFET which employs a super-junction structure in which a drift region is a collection of column-shaped p-type and n-type regions that are arranged in parallel and in close contact with each other on a low-resistivity semiconductor substrate and extend perpendicularly to its major surface. Furthermore, in this manufacturing method, deterioration of the characteristics is prevented by decreasing the number of thermal history events to which the super-junction structure is subjected in post manufacturing steps.

However, according to the disclosure of US-A1-2003-0008483, in the manufacturing method of an SJ-MOSFET, in the case where the breakdown voltage rating is 600 V, the thickness (in the direction perpendicular to the major surface of the substrate) of the SJ column structure that is necessary for attaining such a breakdown voltage is about 50 μm. An SJ-MOSFET is manufactured by forming MOS gate structures on the front side, decreasing the wafer thickness to about 50 μm by grinding the back surface, and finally forming an SJ column structure. However, such a thin wafer is very prone to break and hence the yield tends to be low.

If an SJ-MOSFET is manufactured by using a thick wafer (more than 350 μm in thickness) without grinding the back surface of a wafer unlike in the above method, the trench width needs to be 6 μm and the trench depth becomes at least 350 μm. No practical manufacturing technique for forming such deep trenches stably by etching has been established yet. In addition, in the above-mentioned method, strictly positioning patterns on two surfaces requires a precision double-side mask aligner.

Furthermore, as for the trench etching from the back surface, it is necessary to stop the etching accurately at the bottom portions of the surface p-type base regions (Xj depth: 3 to 5 μm). The breakdown voltage decreases in either case of the etching depth being too small or too large. This is problematic in that the breakdown-voltage-related yield tends to be low. The present invention is directed to overcoming or at least reducing the effects of one or more of the problems set forth above.

SUMMARY OF THE INVENTION

The present invention has been made in view of the above problems in the art, and an object of the invention is therefore to provide a manufacturing method of a super-junction semiconductor device which solves or avoids the problems of US-A1-2003-0008483 in manufacture of an SJ-MOSFET by the buried-trench epitaxial method, and which can thus increase the breakdown-voltage-related yield by reducing variations in the impurity dopants of p-type regions (columns) and n-type regions (columns) by decreasing, by a different manufacturing method, the number of thermal history events that occur after formation of the p-type regions (columns) and n-type regions (columns).

To attain the above object, the invention provides a manufacturing method of a super-junction semiconductor device comprising a first step of depositing, on a low-resistivity semiconductor substrate of one conductivity type, at least an epitaxial layer of the one conductivity type which is to become a drift layer; a second step of forming a base region or regions of the other conductivity type and source regions of the one conductivity type to be used for formation of MOS gate structures in an active portion where a main current is to flow; a third step of forming, by anisotropic etching using an insulating film mask, trenches that penetrate through the base region or regions and reach the low-resistivity semiconductor substrate or its vicinity (i.e., in some cases trenches are formed so as not to completely penetrate through the n-type epitaxial layer and hence do not reach the substrate); and a fourth step of burying epitaxial layers of the other conductivity type in the respective trenches, the first to fourth steps being executed in this order.

It is preferable that the second step be a step of forming base regions of the other conductivity type and source regions of the one conductivity type both of which extend to right under end portions of an insulating film mask formed on the epitaxial layer of the one conductivity type by performing selective ion implantation through openings of the insulating film mask and causing thermal diffusion to form planar MOS gate structures in an active portion where a main current is to flow; and that the manufacturing method further comprise the steps, executed after the fourth step in the following order, of making surfaces of the epitaxial layers of the other conductivity type buried in the trenches approximately flush with a surface of the epitaxial layer of the one conductivity type; forming regions of the other conductivity type having a higher impurity concentration than the epitaxial layers of the other conductivity type as surface layers of the latter at the same depth as the base regions; forming high-impurity-concentration regions of the one conductivity type in a prescribed pattern as surface layers of the high-impurity-concentration regions of the other conductivity type at the same depth as the source regions; and removing the insulating film mask, forming a field oxide film on a peripheral voltage withstanding structure that surrounds the active portion, and then forming prescribed planar MOS gate structures.

More particularly, it is preferable that the second step be a step of forming a base region of the other conductivity type and then forming trench MOS gate structures including source regions of the one conductivity type, trenches which are deeper than the base region, gate oxide films covering side walls of the trenches, and gate electrodes buried in the respective trenches; and that the third step be a step of forming trenches that penetrate through the base region and reach the low-resistivity semiconductor substrate or its vicinity, between the trench MOS gate structures by performing anisotropic etching using an insulating film mask from the side of a surface of the base region. It is desirable that the field oxide film be a CVD oxide film.

In short, the invention is intended to make the thermal history that is performed after formation of a p-type/n-type column structure less severe by forming (parts of) MOS gate structures before formation of the column structure. More specifically, a p-type base region(s) and n$^+$ source regions which will become parts of MOS gate structures are formed by diffusion before trenches for formation of p-type regions (columns) are formed in an n-type epitaxial layer by etching. Then, trenches for formation of columns are formed and p-type epitaxial layers are buried in the respective trenches. Then, to increase the breakdown resistance, high-impurity-concentration, p$^+$ regions are formed on the surfaces of the p-type epitaxial layers and polysilicon gate electrodes are formed. An interlayer insulating film made of BPSG (borophospho silicate glass) or the like and an Ai-Si source electrode are formed on the gate electrodes, and a drain metal electrode which is a lamination film of Ti, Ni, and Au films, for example, is formed on the back side. A wafer of a super-junction semiconductor device is thus completed.

With the above manufacturing method, the number of thermal history events that occur after formation of a p-type/n-type column structure is very small, as a result of which p-type and n-type regions (columns) can be obtained which have approximately step-like impurity concentration profiles at the pn junctions. Either planar or trench-type gate structures can be formed. A field oxide film of at least hundreds of nanometers is necessary in a peripheral voltage withstanding structure of a chip. Forming the field oxide film by CVD is preferable because it can make the thermal history even less severe.

According to the invention, no steps with severe thermal history of forming p-type base regions and n-type source regions are performed after formation of p-type and n-type regions (columns), whereby the mutual impurity diffusion between the p-type and n-type regions (columns) can be suppressed. As such, the invention provides a manufacturing method of a super-junction semiconductor device which can increase the breakdown-voltage-related yield by reducing variations in the impurity dopes of p-type and n-type regions (columns).

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Figure 3:
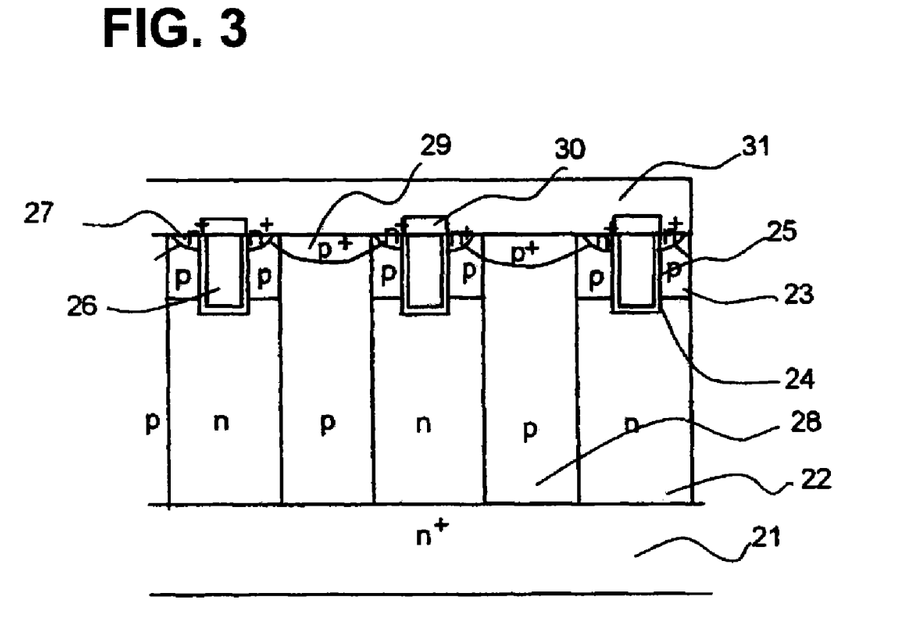
FIG. 3 is a sectional view of an important part of a trench gate SJ-MOSFET according to a second embodiment of the invention.

Manufacturing methods of a super-junction semiconductor device according to embodiments of the present invention will be described hereinafter in detail with reference to the drawings. FIGS. 1A-1M are sectional views of important parts of a semiconductor substrate showing part of a manufacturing method of an SJ-MOSFET according to a first embodiment of the invention. FIG. 3 is a sectional view of an important part of a trench gate SJ-MOSFET according to a second embodiment of the invention. The invention is not limited to the following embodiments as long as it is within the spirit and scope of the invention.

Embodiment 1

Figure 1A:
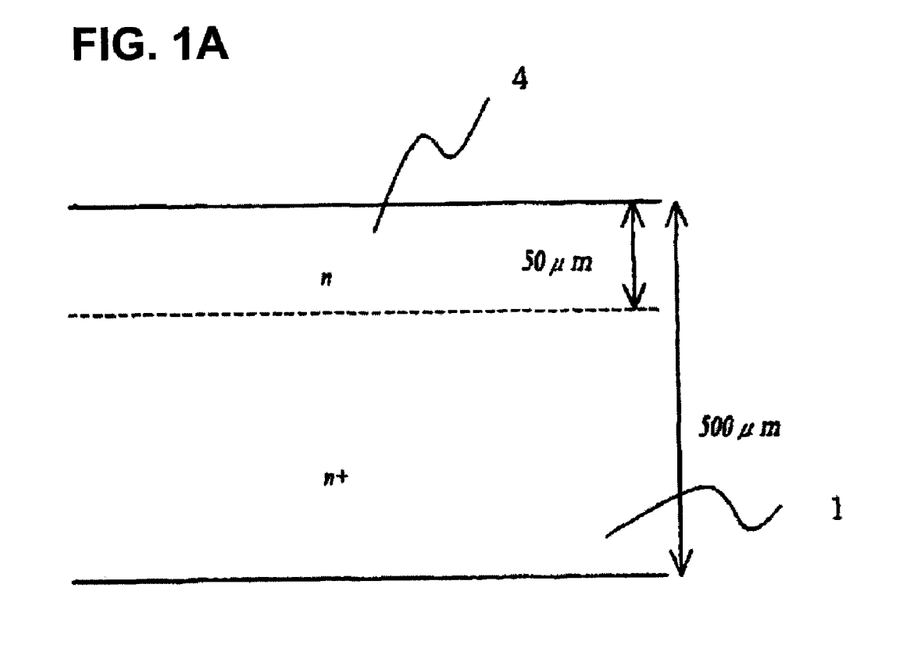
FIGS. 1A-1M are sectional views of important parts of a semiconductor substrate showing part of a manufacturing method of an SJ-MOSFET according to a first embodiment of the present invention.
Figure 1B:
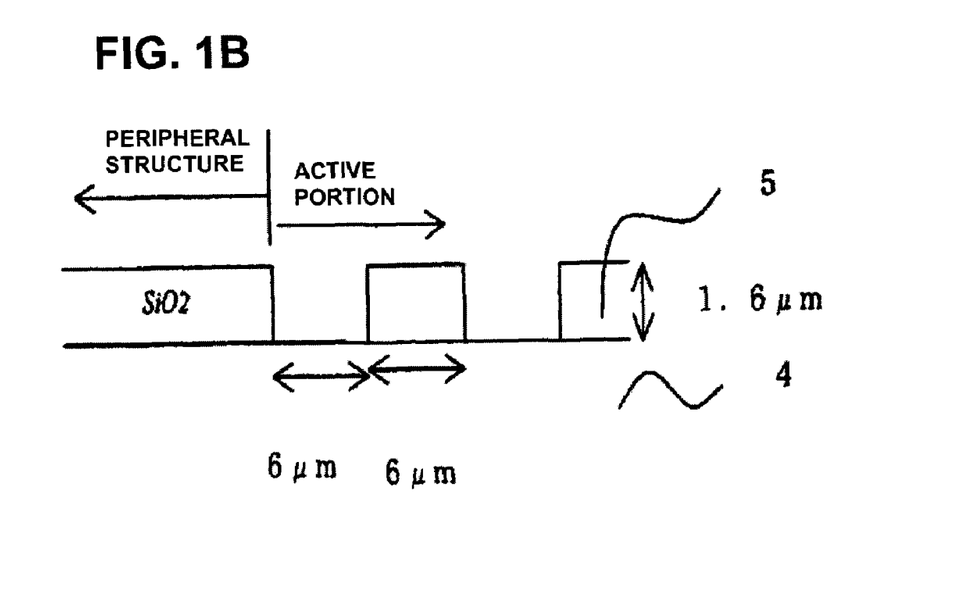

FIGS. 1A-1M are sectional views of important parts of a semiconductor substrate showing part of a manufacturing method of an SJ-MOSFET having a breakdown voltage rating of 600 V. As shown in FIG. 1A, a wafer having a total thickness of 500 µm is prepared in which a 50-µm-thick n-type epitaxial layer 4 having a phosphorus concentration of $4 \times 10^{15}$ cm$^{-3}$ is grown on an n-type single crystal silicon substrate (doped with antimony) having a resistivity of 0.01 Ω·cm. Then, a 1.6-µm-thick oxide film 5 is grown by thermal oxidation at 1,100° C. Then, as shown in FIG. 1B, an oxide film mask is formed by removing 6-µm-wide portions from the oxide film 5 at regular intervals of 6 µm, that is, by performing patterning and etching on an active portion where a main current is to flow. Then, boron ions are implanted (applied to the entire surface) at a dose of $4 \times 10^{14}$ cm$^{-2}$ and driven at 1,150° C. for 3 hours, whereby 2-µm-deep p-type base regions 6 to become channel forming regions are formed. Then, as shown in FIG. 1C, phosphorus ions are implanted at a dose of $4 \times 10^{15}$ cm$^{-2}$ and driven at 1,100° C. for 1 hour, whereby 1-µm-deep n-type source regions 7 are formed.

In conventional MOSFETs, usually, n-type source regions 7 are formed by implanting arsenic for the following reason. Since arsenic as an n-type dopant has a small diffusion coefficient, it is not prone to move during thermal treatment and hence makes it possible to control the pn junction positions accurately. However, in this embodiment, it is necessary that the pn junctions of n-type source regions 7 and p-type base regions 6 be sufficiently distant from the end portions of mask oxide film 5 directly downward. This is to prevent n-type source regions 7 from being etched away completely by side etching in trench etching of the next step. The use of phosphorus having a larger diffusion coefficient is favorable for making the pn junctions sufficiently distant from the end portions of oxide film 5 directly downward.

Figure 1C:
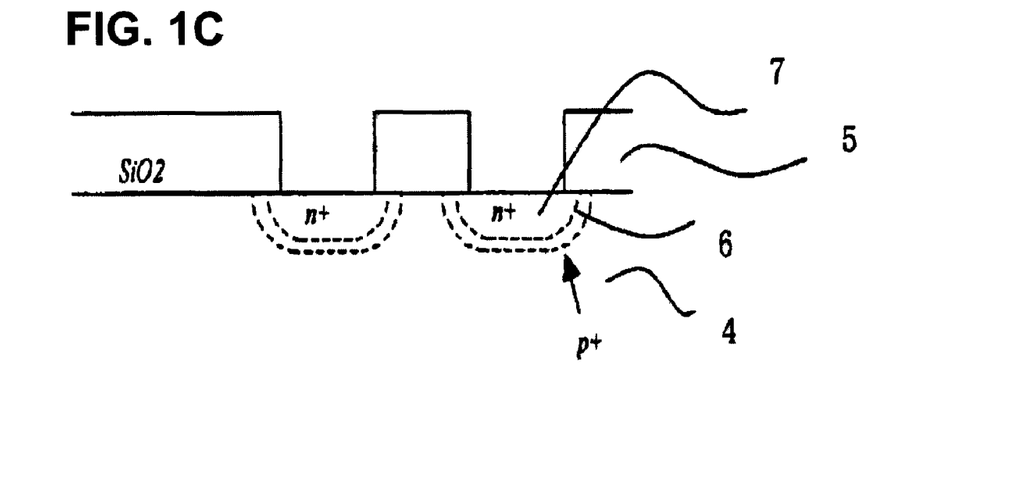

In the example of FIG. 1C, the depths of p-type base regions 6 and n-type source regions 7 are 2 µm and 1 µm, respectively. Therefore, if it is assumed that p-type base regions 6 and n-type source regions 7 expand parallel with the surface by approximately the same length as in the depth direction, each p-type base region 6 expands horizontally on both sides by about 2 µm under the associated 6-µm-wide portion of oxide film 5. Therefore, if the depths of p-type base regions 6 and n-type source regions 7 were set at 3 µm and 2 µm, respectively, in FIG. 1C, it would be necessary to form the pattern of oxide film 5 in the following manner. That is, the width of oxide film portions is set at 8 µm and the width of exposed portions of the silicon surface between the oxide film portions is set at 8 µm so that adjoining p-type base regions 6 do not contact each other at the surface.

Figure 1D:
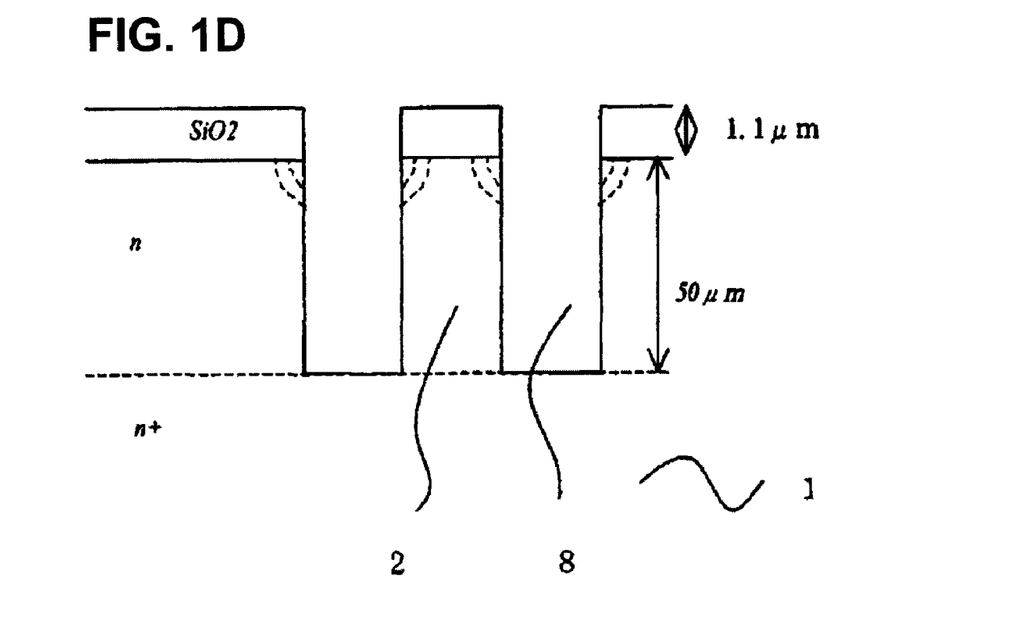
Figure 1E:
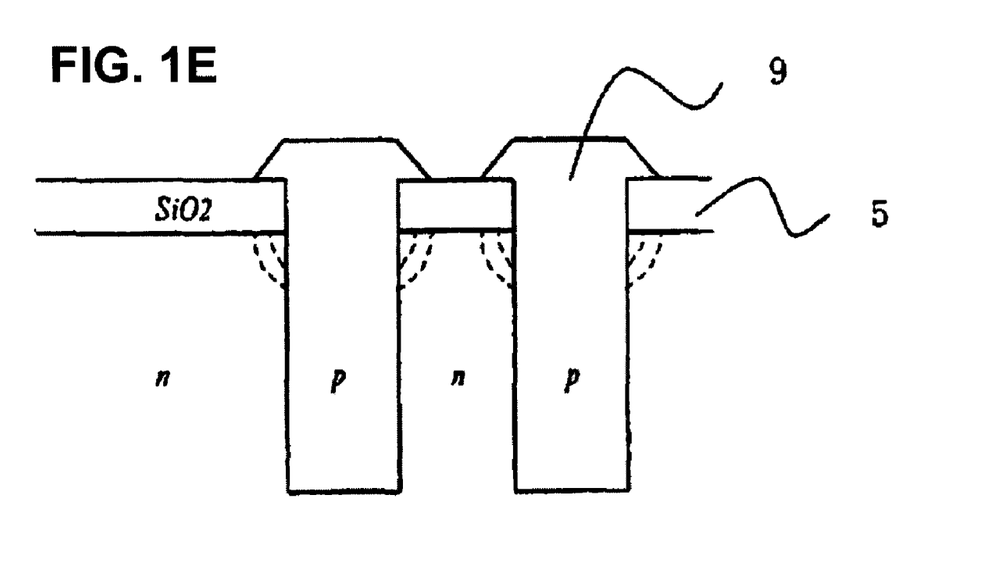
Figure 1F:
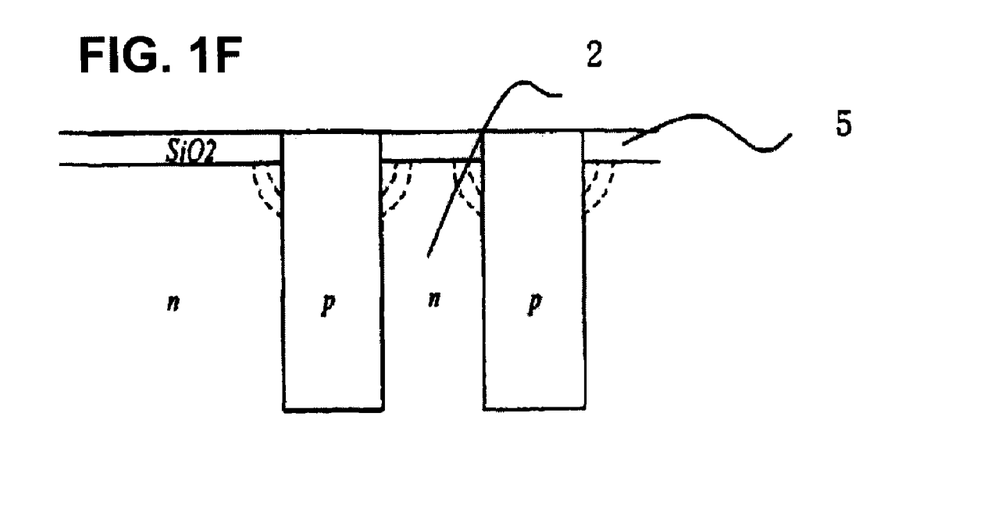
Figure 1G:
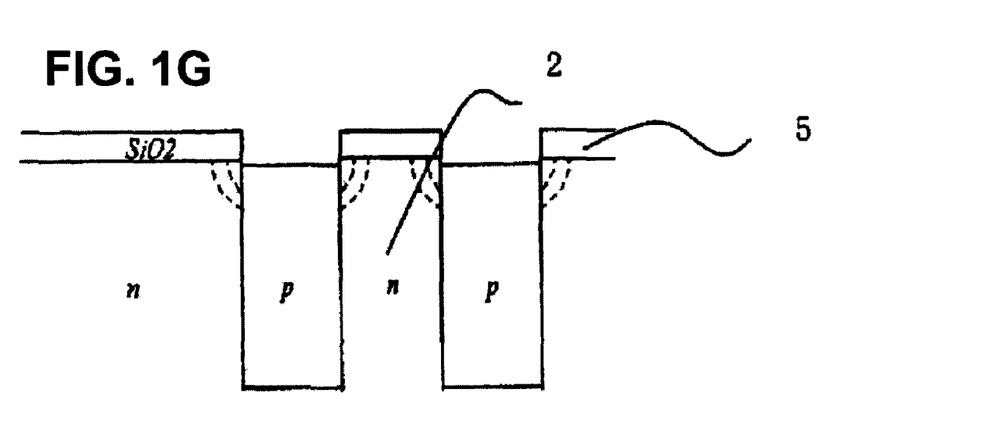

Subsequently, as shown in FIG. 1D, trenches 8 of 6 µm in width and 50 µm in depth are formed by etching the silicon wafer by reactive ion etching (RIE) which is highly anisotropic by using the oxide film 5 as a mask. During that course, the thickness of the oxide film 5 is decreased by 0.5 µm to 1.1 µm. Then, as shown in FIG. 1E, p-type epitaxial silicon 9 is buried in trenches 8 while trichlorosilane, hydrogen, diborane, and hydrogen chloride are supplied simultaneously. As shown in FIG. 1F, the front surface is planarized by chemical mechanical polishing (CMP) which is stopped when oxide film 5 is exposed. As shown in FIG. 1G, surface-exposed silicon is etched away, whereby the steps of the silicon surface are reduced in height and the silicon surface is thereby made approximately flat. SJ columns 2 and 3 are formed by the above steps.

Figure 1H:
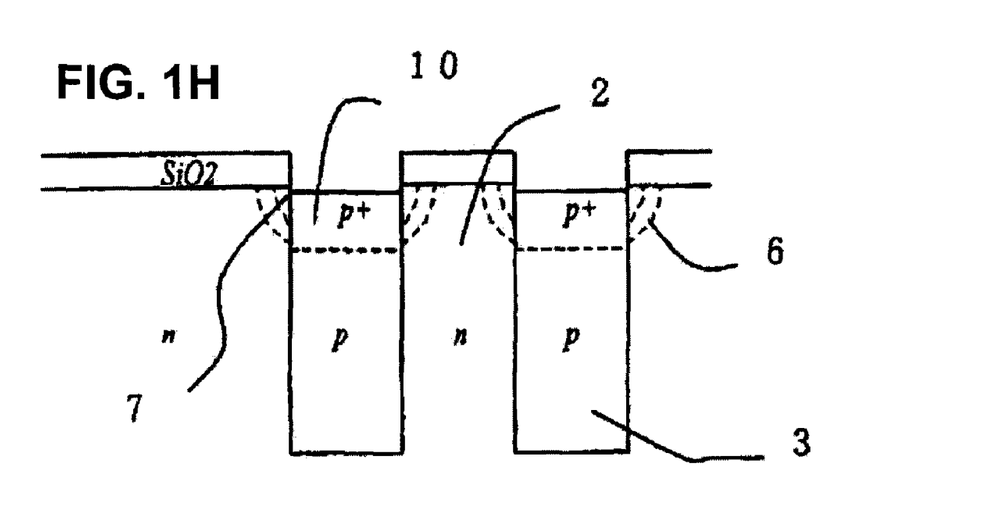
Figure 1I:
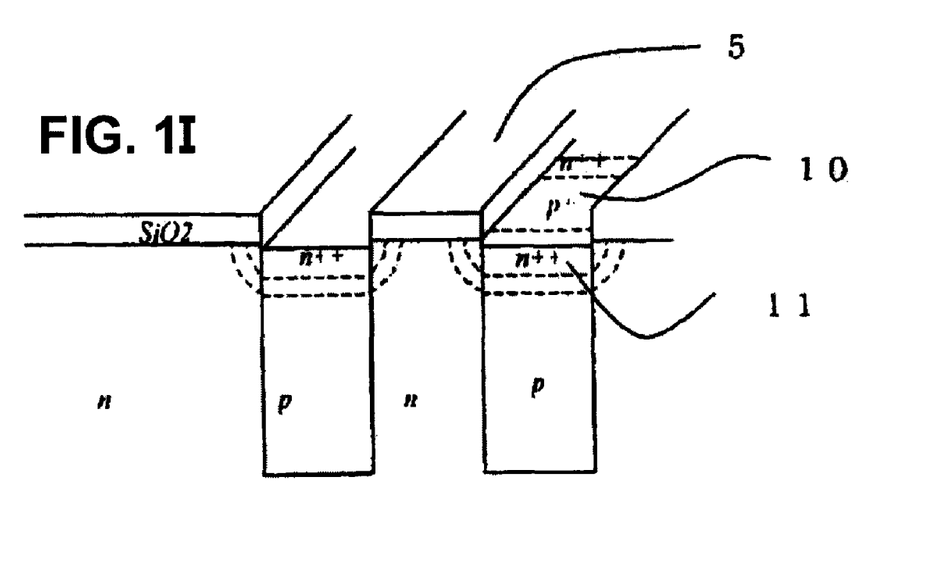

Then, boron ions are implanted at $3 \times 10^{15}$ cm$^{-2}$ after a resist is applied and patterned. After the resist is removed, annealing is performed at 1,100° C. for 1 hour, whereby high-impurity-concentration second p$^+$ regions 10 are formed as shown in FIG. 1H. The high-impurity-concentration second p$^+$ regions 10 are necessary for increasing the breakdown resistance. After a resist is applied and patterned again, arsenic ions are implanted at $4 \times 10^{15}$ cm$^{-2}$. After the resist is removed, driving is performed at 1,100° C. for 1 hour, whereby n$^+$ source regions 11 which are to contact a source electrode are formed as shown in FIG. 1I. The n$^+$ source regions 11 are formed at certain intervals in ladder form (when viewed from above). N$^+$ source regions 11 are formed to increase the breakdown resistance.

Figure 1J:
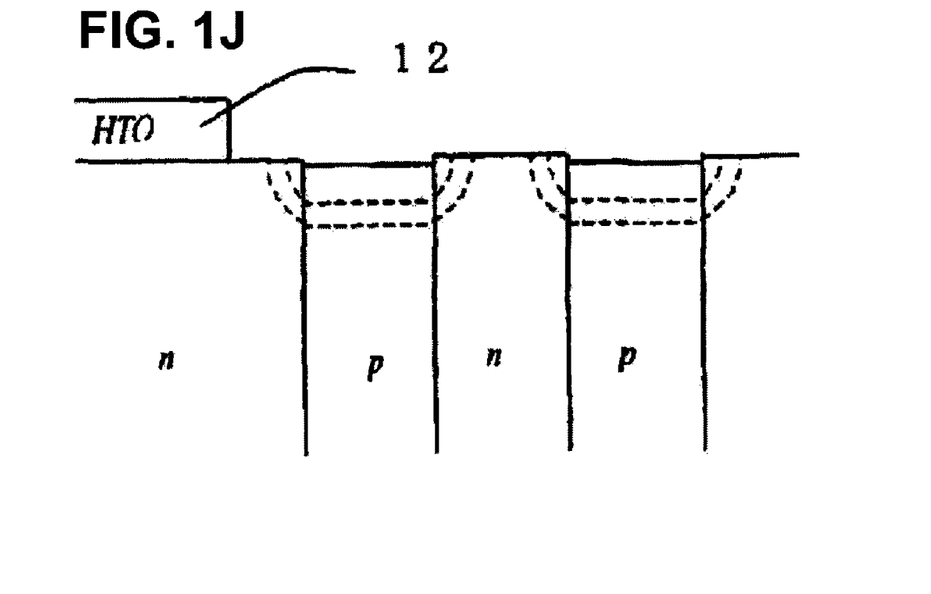
Figure 1K:
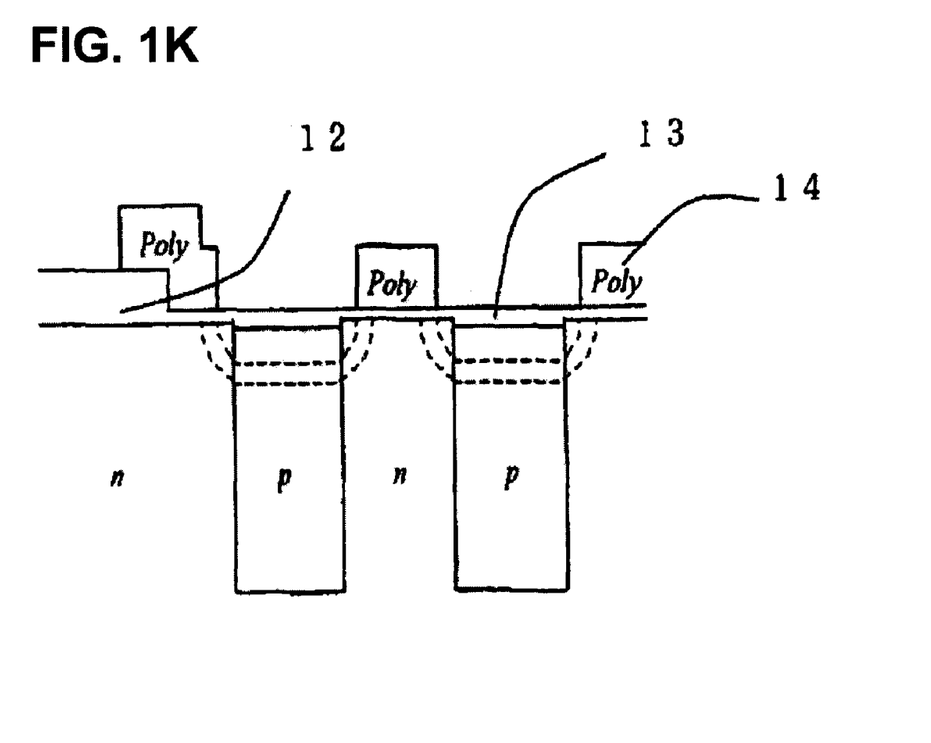
Figure 1L:
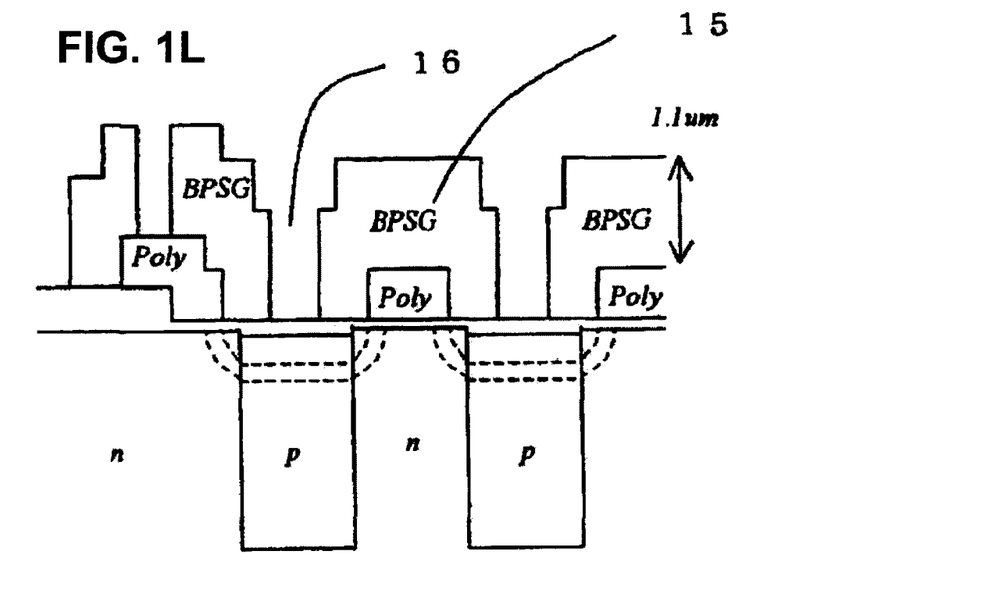
Figure 1M:
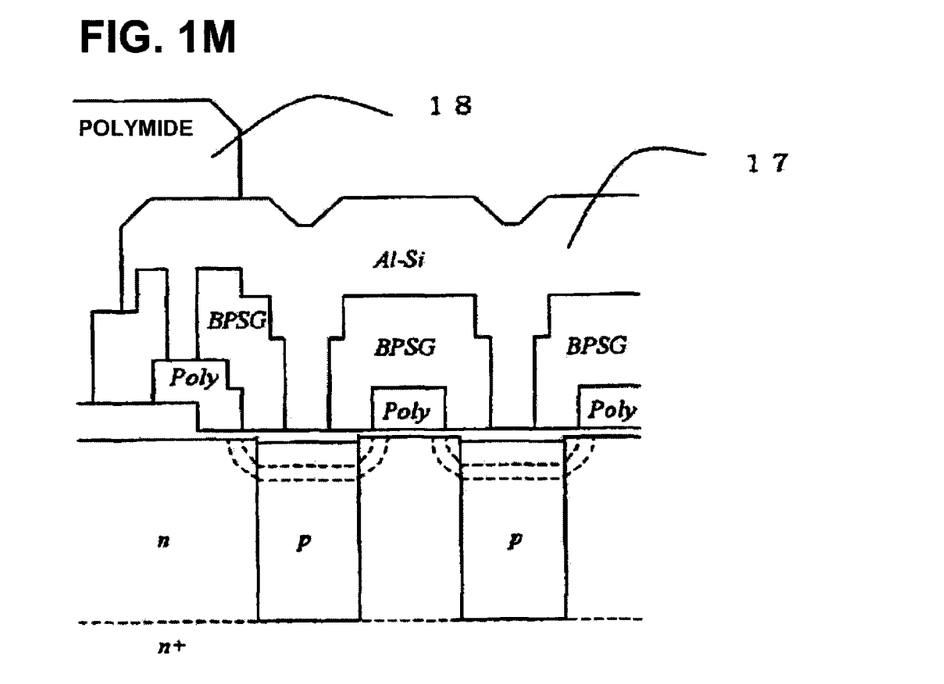

After oxide film 5 is removed entirely, a known HTO (high temperature oxide) film is grown at a thickness of 0.4 µm as field oxide film 12 to protect the surface of a peripheral voltage-withstanding structure that surrounds the active portion. As shown in FIG. 1J, that portion of the HTO film which corresponds to the active portion where a main current of the device is to flow is removed by photolithography and etching. Then, a 1,000-Å-thick gate oxide film 13 is grown at 900° C. and 0.5 µm-thick polysilicon to become gate electrodes 14 is deposited thereon. As shown in FIG. 1K, windows are formed through the polysilicon layer by patterning and RIE. Then, as shown in FIG. 1L, a 1.1-µm-thick BPSG (boro-phospho silicate glass) is grown as an interlayer insulating film 15 and contact holes 16 are formed by patterning and etching. Then, a 5-µm-thick Al—Si layer is grown as source electrode 17. After the Al—Si layer is patterned, a polyimide protective film 18 is formed as shown in FIG. 1M. After the back surface of the silicon substrate is ground, a back drain electrode (lamination film) is formed by evaporating Ti, Ni, and Au, for example. The wafer process is thus completed.

In the first embodiment, the MOS gate structures including p-type base regions 6 and the n-type source regions 7 are formed before formation of the SJ column structure. Therefore, the SJ column structure is subjected to a smaller number of thermal history events and hence the mutual impurity diffusion between p-type regions (columns) 3 and n-type regions 2 (columns) is suppressed. The breakdown-voltage-related yield can thus be increased.

Embodiment 2

FIG. 3 is a sectional view of an important part of a trench gate SJ-MOSFET according to the second embodiment of the invention. As shown in FIG. 3, this SJ-MOSFET is manufactured in the following manner. A 50-μm-thick n-type silicon epitaxial layer 22 is grown on a low-resistivity n+ silicon substrate 21. Boron ions are implanted into a surface active region (where a main current of the device is to flow) of epitaxial layer 22 and diffused at 1,150° C. for 3 hours in an oxidizing atmosphere, whereby p-type base region 23 of 2 μm in depth is formed. A mask oxide film (not shown) is formed by patterning, by photolithography, a thermal oxide film that was formed on the surface when p-type base region 23 was formed. Anisotropic etching is performed on the non-masked opening portions from the front side by reactive ion etching (RIE), whereby trenches 24 of 1.5 μm in width and 2.5 μm in depth are formed at intervals of 12 μm so as to penetrate through p-type base region 23 and reach n-type epitaxial layer 22. After the sacrificial oxide film and the mask oxide film are removed, gate oxide films 25 are formed on the surfaces of the trenches. Then, gate electrodes 26 are formed by burying deposited polysilicon layers in the respective trenches. After patterning is performed, n+ source regions 27 are formed in substrate surface regions adjacent to the openings of trenches 24 by ion-implanting and diffusing an n-type dopant.

After a CVD oxide film is deposited and an oxide film mask pattern is formed, trenches of 6 μm in width and 50 μm in depth are formed through p-type base regions 23 between trenches 24 by performing anisotropic RIE from the front side. Then, as in the first embodiment, p-type epitaxial silicon 28 is buried in the respective trenches 24 while trichlorosilane, hydrogen, diborane, and hydrogen chloride are supplied simultaneously. The front surface is planarized by chemical mechanical polishing (CMP) which is stopped when the mask oxide film is exposed. Surface-exposed silicon is etched away, whereby the steps of the silicon surface are reduced in height and the silicon surface is thereby made approximately flat. SJ columns 22 and 28 are thus formed. Then, boron ions are implanted at $3 \times 10^{15}$ cm$^{-2}$ after a resist is applied and patterned. After the resist is removed, annealing is performed at 1,100° C. for 1 hour, whereby high-impurity-concentration second p+ regions 29 are formed. Then, as in the first embodiment, interlayer insulating film 30, source metal electrode 31 (formed on interlayer insulating film 30), a back drain electrode (not shown), etc. are formed. The wafer process is thus completed.

In the second embodiment, as in the case of the first embodiment, the MOS gate structures including p-type base regions 6, n-type source regions 7, channels (not shown), and gate oxide films 25 are formed before formation of the SJ column structure. Therefore, the SJ column structure is subjected to a smaller number of thermal history events and hence the mutual impurity diffusion between p-type regions 28 (columns) and n-type regions 22 (columns) is suppressed. The breakdown-voltage-related yield can thus be increased.

Thus, a manufacturing method of a super-junction semiconductor device has been described according to the present invention. Many modifications and variations may be made to the techniques and structures described and illustrated herein without departing from the spirit and scope of the invention. Accordingly, it should be understood that the methods described herein are illustrative only and are not limiting upon the scope of the invention.

What is claimed is:

1. A method of manufacturing a super-junction semiconductor device comprising, in order:
   (a) depositing, on a low-resistivity semiconductor substrate of a first conductivity type, at least an epitaxial layer of the first conductivity type which is to become a drift layer;
   (b) forming, in one surface of the epitaxial layer, at least one base region of a second conductivity type and source region of the first conductivity type to be used for formation of MOS gate structures in an active portion where a main current is to flow;
   (c) forming, by anisotropic etching using an insulating film mask, trenches that penetrate through the at least one base region and reach the low-resistivity semiconductor substrate or its vicinity; and
   (d) burying epitaxial layers of the second conductivity type in the respective trenches.

2. The method according to claim 1, wherein (b) comprises forming a base region of the second conductivity type and then forming trench MOS gate structures including source regions of the first conductivity type, and (c) comprises forming trenches between the trench MOS gate structures from the surface of the base region by performing anisotropic etching using an insulating film mask, wherein the trenches are deeper than the base region and penetrate through the base region and reach the low-resistivity semiconductor substrate or its vicinity, and wherein gate oxide films cover side walls of the trenches, and gate electrodes are buried in the trenches.

3. A method of manufacturing a super-junction semiconductor device comprising, in order:
   (a) depositing, on a low-resistivity semiconductor substrate of a first conductivity type, at least an epitaxial layer of the first conductivity type which is to become a drift layer;
   (b) forming, in one surface of the epitaxial layer, base regions of a second conductivity type and source regions of the first conductivity type, both of which extend to right under end portions of an insulating film mask formed on the epitaxial layer of the first conductivity type by performing selective ion implantation through openings of the insulating film mask and causing thermal diffusion;
   (c) forming, by anisotropic etching, using the insulating film mask, trenches that penetrate through the base regions and reach the low-resistivity semiconductor substrate or its vicinity;
   (d) burying epitaxial layers of the second conductivity type in the respective trenches;
   (e) making surfaces of the epitaxial layers of the second conductivity type buried in the trenches approximately flush with a surface of the epitaxial layer of the first conductivity type;
   (f) forming regions of the second conductivity type having a higher impurity concentration than the epitaxial layers of the second conductivity type as surface layers of the latter at the same depth as the base regions;
   (g) forming high-impurity-concentration regions of the first conductivity type in a prescribed pattern as surface layers of the high-impurity-concentration regions of the other conductivity type at the same depth as the source regions; and
   (h) removing the insulating film mask, forming a field oxide film on a peripheral voltage withstanding structure that surrounds the active portion, and then forming prescribed planar MOS gate structures.

4. The method according to claim 3, wherein the field oxide film is a CVD oxide film.

* * * * *